(12) United States Patent
Dauphinee

(10) Patent No.: US 7,970,373 B2
(45) Date of Patent: *Jun. 28, 2011

(54) DIRECT DIGITAL CONVERSION TUNER AND METHOD FOR USING SAME

(75) Inventor: Leonard Dauphinee, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/406,518

(22) Filed: Mar. 18, 2009

(65) Prior Publication Data

US 2009/0181629 A1 Jul. 16, 2009

Related U.S. Application Data

(63) Continuation of application No. 10/952,168, filed on Sep. 29, 2004, now Pat. No. 7,522,901.

(60) Provisional application No. 60/537,025, filed on Jan. 20, 2004.

(51) Int. Cl.
*H04B 1/26* (2006.01)
*H04K 3/00* (2006.01)

(52) U.S. Cl. .................. 455/324; 341/126; 375/316

(58) Field of Classification Search .................. 455/324; 341/126, 143, 155; 375/316
See application file for complete search history.

(56) References Cited

U.S. PATENT DOCUMENTS

| 5,557,642 A * | 9/1996 | Williams ...................... 375/316 |
|---|---|---|
| 5,956,624 A | 9/1999 | Hunsinger et al. |
| 5,963,856 A | 10/1999 | Kim et al. |
| 6,373,418 B1 | 4/2002 | Abbey |
| 6,744,832 B2 | 6/2004 | Miao |
| 7,522,901 B2 | 4/2009 | Dauphinee |
| 2002/0012152 A1 | 1/2002 | Agazzi et al. |
| 2002/0034191 A1 | 3/2002 | Shattil |
| 2002/0080898 A1 | 6/2002 | Agazzi et al. |
| 2004/0146127 A1 | 7/2004 | Kent et al. |
| 2005/9157818 | 7/2005 | Dauphinee |

FOREIGN PATENT DOCUMENTS

| WO | WO 2004/068731 | 8/2004 |
|---|---|---|
| WO | WO 2004/068731 A2 | 8/2004 |

OTHER PUBLICATIONS

M. Arndt et al., "Software radio: the challenges for reconfigurable terminals;" Ann. Telecommun., 2002, 57, pp. 570-612.
European Search Report for European Application No. 05000812.7 mailed on May 31, 2005.
European Search Report for European Application No. 04030735.7 mailed on May 31, 2005.

* cited by examiner

*Primary Examiner* — Lee Nguyen
(74) *Attorney, Agent, or Firm* — Sterne, Kessler, Goldstein & Fox P.L.L.C.

(57) ABSTRACT

A direct sampling tuner includes a low noise amplifier and an optional dynamically configurable band pass filter coupled to the low noise amplifier. The optional filter is configured to pass a selected band of channels. The tuner further includes a relatively high accuracy, multi-bit analog-to-digital converter ("ADC") coupled to the LNA or to the optional dynamically configurable band pass filter. The ADC operates at greater than about twice a frequency of a sampled signal. The ADC directly samples the spectrum of the selected channels at the Nyquist rate, thus avoiding image problems presented by conventional tuners.

18 Claims, 1 Drawing Sheet

DIRECT DIGITAL CONVERSION TUNER AND METHOD FOR USING SAME

CROSS REFERENCE TO RELATED APPLICATIONS

Figure 1:
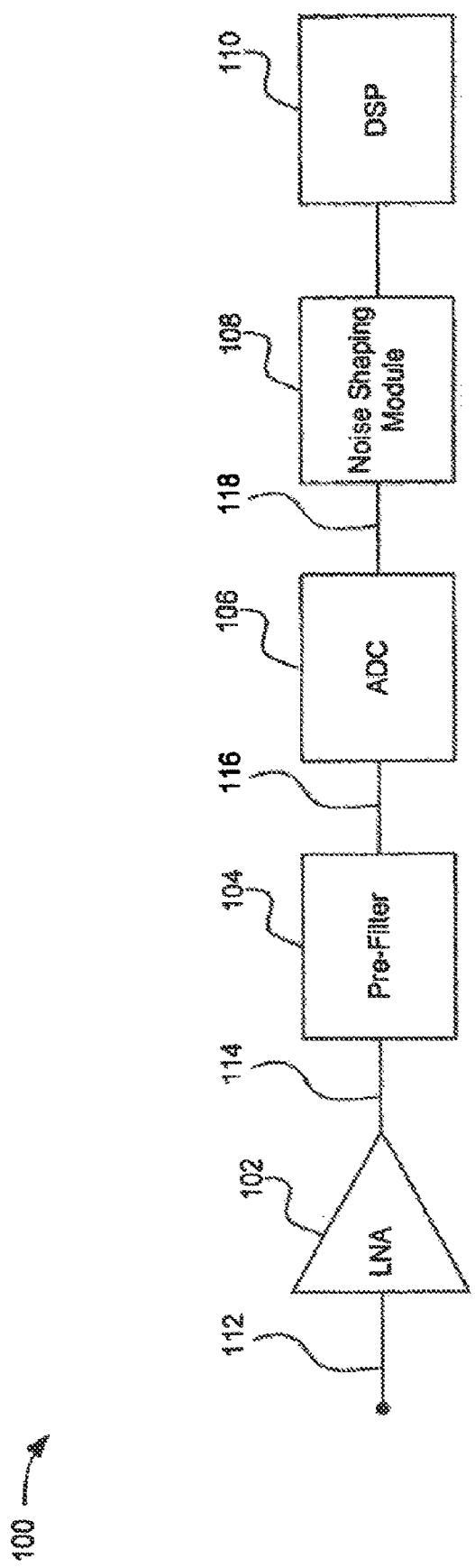

This application is a continuation of U.S. patent application Ser. No. 10/952,168 filed on Sep. 29, 2004, now U.S. Pat. No. 7,522,901, which claims the benefit under 35 U.S.C. §119(e) to U.S. Provisional Application No. 60/537,025, filed Jan. 20, 2004, the contents of which are incorporated by reference herein in their entireties.

BACKGROUND OF THE INVENTION

1. Field of the Invention

The invention relates to tuners.

2. Related Art

Radio frequency (RF) tuners extract information from a selected channel within a spectrum of available channels. RF tuners are used in, for example, cable modems, satellite set top boxes, cable set top boxes, and the like.

What are needed, therefore, are improved methods and systems for tuning an RF signal.

SUMMARY OF THE INVENTION

The present invention is directed to improved methods and systems for tuning. More particularly, the invention relates to direct sampling tuners. The invention can be implemented in, for example, cable modems, satellite set top boxes, cable set top boxes, and the like. The present invention reduces or eliminates mixers, SAW filters, and other analog components.

In accordance with one embodiment of the present invention, a direct sampling tuner includes a relatively high accuracy, multi-bit analog-to-digital converter ("ADC"). In this embodiment, the ADC operates at greater than twice the frequency of a sampled signal. The ADC directly samples a spectrum of selected channels at or above a Nyquist rate.

In one example, a front end of the direct sampling tuner includes a low noise amplifier ("LNA"). In this example, an entire band is digitized so that the multiple channels can be demodulated using a digital signal processor ("DSP").

In another example, a front end of the direct sampling tuner includes a LNA and/or a dynamically configurable band pass filter. In the latter example, the filter is configured to pass a selected band of channels. Use of the filter in this latter example reduces the complexity required of the ADC.

In one example, the ADC directly samples the channels and passes the resultant multi-bit information to a digital signal processor for channel filtering and/or other processes.

In one example, multi-bit noise shaping is utilized to further reduce the complexity of the ADC.

Additional features and advantages of the invention will be set forth in the description that follows. Yet further features and advantages will be apparent to a person skilled in the art based on the description set forth herein or may be learned by practice of the invention. It is to be understood that both the foregoing summary and the following detailed description are exemplary and explanatory, and are intended to provide further explanation of the invention as claimed.

BRIEF DESCRIPTION OF THE DRAWINGS/FIGURES

The present invention will be described with reference to the accompanying drawings, wherein like reference numbers may indicate identical or functionally similar elements. Also, the leftmost digit(s) of the reference numbers may identify the drawings in which the associated elements are first introduced.

FIG. 1 is a block diagram of a direct sampling tuner, according to one embodiment of the present invention.

DETAILED DESCRIPTION OF THE INVENTION

Introduction

The present invention is directed to improved methods and systems for tuning an RF signal. More particularly, the invention is directed to direct sampling tuning for, among other things, cable modems, satellite set top boxes, cable set top boxes, and the like. Direct sampling is performed at or above the Nyquist rate, or at a sub-sampling rate.

Throughout this description "direct sampling" refers to sampling of a received signal, as opposed to systems that frequency down-convert a received signal prior to demodulation.

The invention includes multiple features that can be implemented alone and/or in various combinations with one another.

Exemplary Tuners

Tuners discriminate between available channels by filtering out unwanted channels. It is generally impractical to filter at higher frequencies because the necessary filter agility and narrowness is prohibitively expensive at higher frequencies. Instead, conventional tuners mix received signals with a lower frequency clock signal to generate lower frequency replicas or images of the received signals. The lower frequency signals are then filtered to obtain the desired signal or channel. The desired signal or channel is then sampled or demodulated to extract the desired channel information therein.

Conventional tuners include heterodyne-based tuners (including super heterodyne-based tuners), which use mixers for the down-conversion process. Mixers essentially sample the modulated signal at less than the Nyquist rate. However, this can cause well known imaging problems. The imaging problems are typically overcome with SAW filters (standing acoustic wave filters). SAW filters have significant losses, so additional gain stages are required. The additional gain stages consume additional power and contribute to poor noise figures. In addition, non-ideal and non-uniform operating characteristics associated with these and other analog components in heterodyne-based tuners make component layout burdensome. For example, placement and interconnection of the SAW filters affect the overall performance of the tuner. As a result, heterodyne-based tuners tend to be expensive in terms of the number of components required, manufacturing efforts, and power consumption.

Conventional tuners also include direct conversion and low IF (intermediate frequency) tuners, in which a mixer is utilized to convert a modulated signal directly to baseband or to a very low frequency. Direct conversion tuners avoid intermediate stages that are normally associated with heterodyne-based tuners, but they also utilize mixers. As a result, low IF tuners also suffer from images, which require significant down-stream correction circuitry. A problem in direct conversion tuners is harmonic mixing where harmonics of the local oscillator frequency mix undesired channels to a baseband on top of the channel of interest. This is especially a problem for broadband signals, such as cable and satellite.

Exemplary Direct Sampling Tuners

FIG. 1 is a block diagram of a tuner 100, according to one embodiment of the present invention. Tuner 100 includes a direct sampling analog-to-digital converter ("ADC") 106. The ADC 106 samples a signal 116 at a Nyquist rate (i.e., greater than twice the frequency of the signal 116). As a result, image problems associated with conventional tuners are substantially eliminated.

A front end of the tuner 100 includes a low noise amplifier ("LNA") 102. The LNA 102 amplifies a received signal 112.

In one example, the front end of the tuner 100 also includes a pre-filter 104. The pre-filter 104 is a dynamically configurable pre-filter, configured to pass a selected band of the amplified signal 112 to the ADC 106.

In one example, the tuner 100 further includes a noise-shaping module 108, which improves the resolution of the output 118 of the ADC 106.

In one example, the tuner 100 further includes a digital signal processor ("DSP") 110. In one example, an entire band received at the ADC 106 is digitized so that multiple or desired channels of the band can be demodulated using the DSP 110.

In this embodiment, the tuner 100 eliminates many of the analog components of conventional tuners, such as mixers, SAW filters, and multiple power-consuming gain stages. This, in turn, reduces manufacturing efforts and component costs. The reduced number of analog components improves the manufacturability of the tuner 100 because digital systems can be manufactured in quantity without the system variabilities that come with analog manufacturing. The reduction of analog components also provides operational power savings over conventional tuners because frequency synthesizers, mixers, SAW filters are not necessary. The reduced number of stages in the tuner 100 (i.e., the LNA 102 is substantially the only gain in the front end) provides improved noise figures.

Exemplary High Speed, High Resolution ADC

In one example, the direct sampling ADC 106 is a high speed, high resolution ADC that effectively samples the entire spectrum of the signal 116 at the Nyquist rate.

For example, in a cable channel environment, where the highest frequency is typically around 860 MHz, the ADC 106 is operated at greater than 1720 MHz. Also, for example, in a satellite environment, where the frequency is about 2150 MHz, the ADC 106 is operated at greater than 4300 MHz. In one example, in order to operate the ADC 106 at one or more of these speeds, the ADC 106 is implemented in an open loop system, i.e., without feedback. In one example, corrections can be implemented downstream in the DSP 110.

In one example, the ADC 106 is a multi-bit ADC. In a cable channel environment the ADC 106 can be, for example, a 10 bit ADC, that can yield ENOB (effective number of bits) of 8 bits. ENOB is the measured performance (in bits) of the ADC 106 with respect to input frequency $f_{IN}$. As $f_{IN}$ increases, overall noise (particularly the distortion components) also increases, thereby reducing the ENOB and SINAD (signal-to-noise and distortion ratio). ENOB is related to SINAD by the following equation:

$$ENOB = \frac{SINAD - 1.76}{6.02}$$

In a satellite environment, the ADC 106 can be a 12 bit ADC. As described below, noise shaping can be employed to reduce the number of bits in the ADC 106, without loss of accuracy.

It is to be appreciated that the ADC 106 can be any number of bits, and respectively, any ENOB, depending on its application and/or environment.

In various examples described below, the ADC 106 is implemented in one or more of a variety of ways.

In one example, the ADC 106 is implemented as a flash ADC. Flash ADCs are well known to those skilled in the art. A Flash ADC uses a series of comparators with different threshold voltages to convert an analog signal to a digital output.

In one example, the ADC 106 is implemented as a sample and hold circuit. Such a sample and hold can be implemented with $2^n$ comparators, where n represents the number of bits in the ADC 106. Sample and hold circuits and comparators are well known to those skilled in the art.

Another example implementation for the ADC 106 is a pipeline ADC or subranging quantizer. Pipeline ADCs are well known to those skilled in the art. A pipeline ADC uses two or more steps of subranging. First, a coarse conversion is done. In a second step, the difference to the input signal is determined with a digital to analog converter (DAC). This difference is then converted finer, and the results are combined in a last step. This type of ADC is fast, has a high resolution and only requires a small die size. As another explanation, pipeline ADCs consist of numerous consecutive stages, each containing a track/hold (T/H), a low-resolution ADC and DAC, and a summing circuit that includes an inter-stage amplifier to provide gain.

In one example, the ADC 106 "sub-samples" the signal 116. Sub-sampling refers to sampling of the signal 116 at less than the Nyquist rate with respect to the carrier frequency of the signal 116, but at the Nyquist rate with respect to the information modulated thereon. For example, for channel having a carrier frequency at 860 MHz, the bandwidth of the channel is typically in the range of 6 Mhz wide. Thus, while the ADC 106 sub-samples the carrier, it over samples the modulating information.

The ADC 106 outputs samples 118, which are processed digitally in the DSP 110 to extract the information from a desired channel. The DSP 110 performs one or more of a variety of operations on the sampled information, as described below.

The ADC 106 is optionally implemented in an interleaved fashion as described in, for example, U.S. patent application Ser. No. 10/085,071 ("the '071 Application") (that published Jun. 27, 2002 as U.S. Patent Application Publication No. 2002-0080898 A1), now U.S. Pat. No. 7,245,638, entitled, "Methods and Systems for DSP Based Receivers," filed on Mar. 1, 2002, and incorporated herein by reference in its entirety.

LNA and Optional Pre-Filter

The received signal 112 is typically a relatively weak signal. The LNA 102 increases the amplitude and/or power of the signal 112 so that it can be processed within the tuner 100. For example, the LNA can be designed to bring the signal 112 up to about 1 volt so that it is big enough to fill substantially all the codes in the ADC 106. ADC codes are well known to those skilled in the relevant art.

Optional pre-filter 104 is utilized to reduce the complexity of the ADC 106. As described above, the ADC 106 samples the spectrum of the signal 116. When the optional pre-filter 104 is omitted, the spectrum of signal 116 is effectively the spectrum of a received signal 112. Omission of the pre-filter 104 is typically suitable when the spectrum of interest in the received signal 112 is relatively narrow or when you want to demodulate multiple channels. When the spectrum of interest in signal 112 is relatively broad, however, the pre-filter 104 is optionally utilized to reduce the spectrum sampled by the ADC 106.

For example, in a cable tuner environment, there can be up to 135 channels, or more, within the signal 112. The pre-filter 104 is optionally implemented as a dynamically configurable band pass filter that passes a selectable band of interest, or sub-set of the channels, to the ADC 106. This reduces the linearity, dynamic range, and number of bits required of the ADC 106. In other words, pre-filter 104 reduces the required complexity of the ADC 106.

In one example, the pre-filter 104 can be implemented as a digitally selectable bank of filters, each filter having a different pass band.

In an example using the pre-filter 104, it provides the selected band of interest, or sub-set of channels, to the ADC 106, which directly samples the selected band of interest. The samples are then processed by the DSP 110 to decode information from one or more selected channels.

In one example, the pre-filter 104 and the LNA 102 are integrated on a same integrated circuit chip. In other examples, the circuit chip can also include additional elements illustrated in FIG. 1.

In one example, the LNA 102 includes autonomous gain control, which will keep the output 114 at a relatively fixed voltage level so that substantially all the codes in the ADC 106 are filled.

Optional Noise Shaping

In one example, noise shaping module 108 performs noise shaping on the output bits 118 of the ADC 106. This allows the ADC 106 to be implemented with fewer bits without loss of accuracy. For example, when X bits are desired (X= 1, 2, 3, . . . ) the ADC 106 is implemented as a X-Y bit ADC (Y=1, 2, 3, but is always less than X) along with noise shaping module 108.

In one example, noise shaping is performed on very low bit samplers, such as 1 or 2 bit samplers. In order to perform noise shaping on higher bit samplers, a relatively high accuracy digital to analog converter ("DAC") is needed in the noise-shaping module 108. In other words, noise shaping is performed to a relatively high resolution.

Digital Signal Processing

The DSP 110 can be implemented in one or more of a variety of ways and with one or more of a variety of features. For example, and without limitation, the DSP 110 can perform one or more of: channel filtering, equalization, demodulation, decimation, and/or gain control.

In the example using the noise-shaping module 108, in one example the noise shaping module is incorporated within the DSP 110.

In one example, the LNA 102 and/or the pre-filter 104 can be implemented on a chip with the DSP 110.

Additional features that can be implemented in the DSP 110, alone and/or in various combinations with one another, are taught in, for example, the '071 application, which is discussed and incorporated by reference above.

CONCLUSIONS

The present invention has been described above with the aid of functional building blocks illustrating the performance of specified functions and relationships thereof. The boundaries of these functional building blocks have been arbitrarily defined herein for the convenience of the description. Alternate boundaries can be defined so long as the specified functions and relationships thereof are appropriately performed. Any such alternate boundaries are thus within the scope and spirit of the claimed invention. One skilled in the art will recognize that these functional building blocks can be implemented by discrete components, application specific integrated circuits, processors executing appropriate software and the like and combinations thereof.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A tuner, comprising:
   an amplifier arranged at a front end of the tuner and configured to be a first element of the tuner to receive and amplify an RF signal;
   a dynamically configurable band pass filter directly connected to the amplifier and configured to pass a selected band of the amplified RF signal; and
   a converter coupled to the dynamically configurable band pass filter, wherein the converter operates at greater than twice a frequency of the selected band of the amplified RF signal.

2. The tuner according to claim 1, wherein the converter comprises an analog-to-digital converter.

3. The tuner according to claim 2, wherein the analog-to-digital converter operates at frequencies greater than 1 GHz.

4. The tuner according to claim 2, wherein the analog-to-digital converter comprises one of a flash analog-to-digital converter, a pipeline analog-to-digital converter, an open loop analog-to-digital converter, between an 8 to 12 bit analog-to-digital converter, or a multiple-stage pipeline analog-to-digital converter wherein each stage of the multiple-stage pipeline analog-to-digital converter comprises one or more bits.

5. The tuner according to claim 2, wherein the analog-to-digital converter comprises a sample and hold module and $2^n$ comparators, wherein n equals a number of bits in the sample and hold module.

6. The tuner according to claim 1, wherein the amplifier comprises a low noise amplifier.

7. The tuner according to claim 1, further comprising a noise shaping module coupled to the converter.

8. The tuner according to claim 7, further comprising a digital signal processor coupled to the noise shaping module.

9. The tuner according to claim 1, wherein the amplifier and the dynamically configurable band pass filter are implemented on a single integrated circuit.

10. The tuner according to claim 1, wherein the amplifier comprises an autonomous gain control configured to keep an output of the amplifier at a fixed voltage level.

11. A method, comprising:
    receiving an RF signal at an amplifier arranged at a front end of a tuner that is a first element of the tuner to receive the RF signal;
    amplifying the RF signal using the amplifier;
    filtering all but a sub-set of channels of the amplified RF signal using a dynamically configurable band pass filter directly connected to the amplifier; and
    converting the sub-set of channels to a digital signal, wherein said converting is performed at a sample rate that is greater than twice a frequency of a highest frequency in the sub-set of channels.

12. The method according to claim 11, further comprising digitally processing the digital signal to obtain information from the sub-set of channels.

13. The method according to claim 12, further comprising noise shaping the digital signal.

14. The method according to claim 12, wherein the digital processing comprises one or more of channel filtering, equalization, demodulation, decimation, and gain control.

15. The method according to claim 11, wherein said converting comprises interleaving.

16. A tuner, comprising:
 an amplifier arranged at a front end of the tuner and configured to be a first element of the tuner to receive and amplify an RF signal;
 a dynamically configurable band pass filter directly connected to the amplifier, and configured to receive the amplified RF signal and pass a selected band of the amplified RF signal;
 a converter coupled to the dynamically configurable band pass filter; and
 a digital signal processor configured to demodulate the selected band of the amplified RF signal.

17. The tuner according to claim 16, wherein the converter operates at greater than twice a frequency of the selected band of the amplified RF signal.

18. The tuner according to claim 16, wherein the converter operates at less than twice a carrier frequency of the selected band of the multiple channels, but at greater than twice a frequency of information modulated on the selected band of the multiple channels.

* * * * *